United States Patent [19]

Varadarajan

[11] Patent Number: 4,551,638
[45] Date of Patent: Nov. 5, 1985

[54] ECL GATE WITH SWITCHED LOAD CURRENT SOURCE

[75] Inventor: Hemmige D. Varadarajan, Sunnyvale, Calif.

[73] Assignee: Advanced Micro Devices, Inc., Sunnyvale, Calif.

[21] Appl. No.: 562,802

[22] Filed: Dec. 19, 1983

[51] Int. Cl.[4] .......................................... H03K 19/086
[52] U.S. Cl. .................................. 307/455; 307/443; 307/270
[58] Field of Search ................ 307/443, 467, 454–456, 307/254, 270

[56] References Cited

U.S. PATENT DOCUMENTS

| | | | |
|---|---|---|---|
| 3,978,347 | 8/1976 | Hollstein et al. | 307/455 |
| 4,276,485 | 6/1981 | Rydval | 307/455 X |
| 4,286,179 | 8/1981 | Konian et al. | 307/455 |
| 4,289,978 | 9/1971 | Konian et al. | 307/455 X |
| 4,347,446 | 8/1982 | Price | 307/443 |
| 4,490,630 | 12/1984 | Freeman | 307/455 |

OTHER PUBLICATIONS

Chang et al., "Complementary Driver for Emitter-Coupled-Logic Gates", IBM Tech. Disc. Bull., vol. 19, No. 12, May, 1977, pp. 4614–4615.
Chan, "High Speed Current Switch Push-Pull Driver", IBM Tech. Disc. Bull., vol. 24, No. 5, Oct. 1981, pp. 2635–2636.

Primary Examiner—Stanley D. Miller
Assistant Examiner—D. R. Hudspeth
Attorney, Agent, or Firm—Patrick T. King; J. Vincent Tortolano; Mark A. Haynes

[57] ABSTRACT

A standard ECL OR/NOR gate is modified to have a single current source connected to the load current source transistors. The single current source is connected to the emitters of each of the load current source transistors. Switching between the two load current source transistors is accomplished by connecting the base of at least one of the load current transistors to a circuit point that tracks the opposite phase. In one embodiment the base of one of the load current source transistors is connected to the common emitter connections of the input transistors and the reference transistor while the base of the other load current source transistor is connected to a reference voltage source $V_{BBL}$ having a value intermediate the extreme values which appear on the common emitter connections of the input transistors and the reference transistors. In an alternate embodiment the base of each load current source transistor is connected to a suitable point which tracks the opposite phase outputs of the particular load current source transistor.

10 Claims, 11 Drawing Figures

ECL GATE WITH SWITCHED LOAD CURRENT SOURCE

BACKGROUND OF THE INVENTION

1. Field of the Invention

This invention relates to an improved ECL OR/NOR gate circuit and, more particularly, refers to an ECL OR/NOR gate which employs a single load current source that is switched between the load current source transistors on the inverting and non-inverting output lines.

2. Discussion of Background and Prior Art

Emitter-coupled logic (ECL) is widely utilized in such diverse applications as instrumentation, computers, phased-array radar, telecommunications systems, and a host of modern electronics applications where high performance is required or desired. Fundamental curcuit design principles and fabrication processes for ECL are well known in the semiconductor art. See, e.g., *Integrated Circuits Applications Handbook*, ed. A. H. Seidman, Chp. 3, "Emitter Coupled Logic", pp. 55-94 (Wiley 1983); and D. A. Hodges et al *Analysis and Design of Digital Integrated Circuits*, pp. 271183 (McGraw-Hill 1983).

Figure 1:
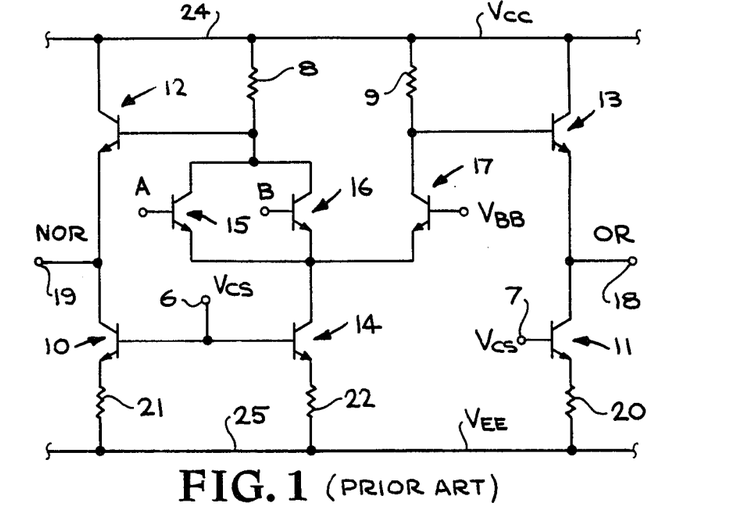
FIG. 1 is an ECL OR/NOR gate of the prior art.

The basic building block for the design of ECL-based integrated circuits is a multiple input OR/NOR gate as shown in FIG. 1. Output line 18 which possesses an OR logic representation of the inputs A, B is driven by emitter-follower 13. When the input on the base of emitter-follower 13 is raised the output line 18 is pulled up or high, representing a digital "1". When the input on the base of emitter-follower 13 is lowered the output line 18 is pulled down by load current source transistor 11 and represents a digital "0". The state of conduction of reference transistor 17 controls emitter-follower 13 as the base of emitter-follower 13 is connected to the collector of reference transistor 17. In a similar manner output line 19 which possesses a NOR representation of the inputs A, B is driven by emitter-follower 12. Here, emitter-follower 12 is controlled by the state of conduction through either of input transistors 15 or 16. Emitter-follower 12 pulls NOR output line 19 up when its base is raised and load current source transistor 10 pulls NOR output line 19 down when the input on the base of emitter-follower 12 is lowered. The two emitter-followers 12 and 13 are never completely off since they set the respective logic levels. They simply conduct always to drive the associated output line to its appropriate voltage level. The bases of each of the two load current source transistors 10 and 11 are controlled by the bandgap reference voltage $V_{CS}$, a stable, sometimes compensated reference voltage available on ECL integrated circuits. See A. H. Seidman, ed. *Integrated Circuits Applications Handbook*, pp. 498-499 (Wiley 1983); and D. A. Hodges et al, *Analysis and Design of Digital Integrated Circuits*, pp. 279-283 (McGraw-Hill 1983). Thus, in the normal operation of a conventional ECL OR/NOR gate circuit the two load current source transistors 10 and 11 are on at all times and draw a steady current. They serve to pull the output line down when the associated emitter-follower tends to turn off and keep the output line low until the associated emitter-follower tends to pull the output line up again. However, implicit in this method of operation is the fact that a given load current source transistor is on at times when it is serving no useful function. Thus, when an output line is intended to be high and is being pulled up by its emitter-follower the current draining through the associated load current source transistor works against the desired operation of the circuit and wastes power. This degrades the delay-power product, a standard measure of performance for ECL devices.

It is therefore an object of the present invention to provide a true complement ECL OR/NOR gate which uses less power.

It is an additional object of the present invention to provide an OR/NOR ECL gate in which a single current source is switched between the two load current source transistors on the respective output lines so that the majority of the current is being drawn by one or the other of the load current source transistors at a given time.

It is another object of the present invention to provide an OR/NOR ECL gate whose load current source transistors draw significant current only when they are pulling down the associated output line.

BRIEF DESCRIPTION OF THE DRAWINGS

For a more complete understanding of the ECL gate with switched load current source of the present invention, reference may be had to the accompanying drawings which are incorporated herein by reference and in which:

FIGS. 5a-5e are timing diagrams showing the interrelationship of voltage levels at various circuit points in the ECL gate of the present invention in which:

SUMMARY OF THE INVENTION

A standard ECL OR/NOR gate is modified to have a single current source connected to the load current source transistors instead of supplying separate, continuous current to each load current source transistor. The single current source is connected to the emitters of each of the load current source transistors. Switching between the two load current source transistors is accomplished by connecting the base of at least one of the load current source transistors to a circuit point that tracks the opposite phase. In one embodiment the base of one of the load current source transistors is connected to the common emitter connections of the input transistors and the reference transistor while the base of the other load current source transistor is connected to a reference voltage source $V_{BBL}$ having a value intermediate the extreme values which appear on the common emitter connections of the input transistors and the reference transistors. In an alternate embodiment the base of each load current source transistor is connected to a suitable point on the opposite phase outputs of the gate. Thus, the majority of the current from the single current source is directed through a given load current transistor at times in the cycle of operation when high-to-low transitions are occurring on the output line associated with the given load current transistor and power consumption is reduced.

DESCRIPTION OF THE PREFERRED EMBODIMENTS

Due to the complementary nature of conventional ECL OR/NOR gates, as shown in the circuit schematic of the prior art gate of FIG. 1, there is an emitter-follower 12 or 13, and a load current source transistor 10 or 11, respectively, associated with each of the two output lines, NOR output line 19 and OR output line 18. In each case it is the load current source transistors 10 or 11 and the associated resistors 21 or 20 which comprise the load current sources for the output lines 18 or 19. Each of these load current sources is continuously on and consuming power even at times when no useful function is being performed. The analysis of current flow and therefore of power consumption shows that a given amount of current is supplied by main current source transistor 14 which is switched between reference transistor 17 and one or more of input transistors 15 and 16 in accordance with the logical operations being performed. This current is required to carry out the logical operation. However, the current in load current source transistors 10 or 11 is only required a portion of the time and 30–40% of the power supplied to the gate is wasted in these load current source transistors.

In accordance with the improved ECL OR/NOR gate of the present invention a single current source is switched between the two load current source transistors as the logic sense of the gate changes. Since the aim of the invention is to reduce power consumption without adversely affecting performance, it is essential that the reduction power should not be gained at the expense of an appreciable increase in delay. It is at least desired that the net delay-power product be improved. Therefore, in the preferred embodiment the driving signal which switches the transistor should occur at least early enough to compensate for any delay added by the switching transistor. Should some additive delay be incurred here it should be more than compensated by the reduction in power to produce a net reduction in delay-power product.

Figure 2:
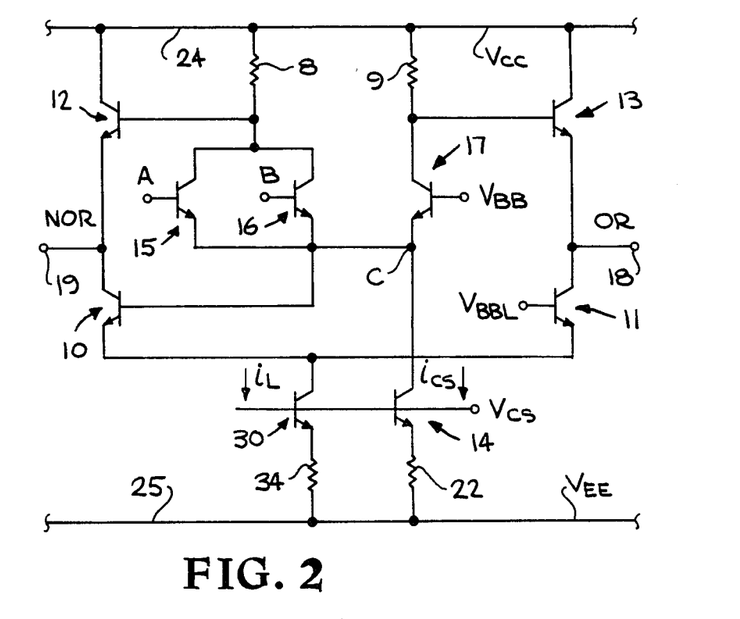
FIG. 2 is an improved ECL OR/NOR gate of the present invention having a single current source which is switched between the load current source transistors of the inverting and noninverting output lines.

The improved ECL OR/NOR gate of the present invention employs a driving signal on the base of at least one of the load current source transistors which driving signal is taken from a circuit point having an out-of-phase relationship with the output line associated with the load current source transistor. Thus, when the out-of-phase signal is high, the load current source transistor will pass more current and tend to pull the associated output line low which is its proper condition. The other load current source transistor will not be turned off but will pass a minority of the current available from the single current source. This may be accomplished, as shown in the embodiment of FIG. 2, by tapping the level at node c and using it to control the base of load current transistor 10. As node c goes high the current from single current source transistor 30 will be switched to flow primarily through load current source transistor 10. This will occur when a high-to-low transition is to occur on NOR output line 19. By applying a reference voltage, $V_{BBL}$, having a specified relationship to the level on node c, to the base of load current source transistor 11, this transistor can later increase its current when the current flow through transistor 10 is reduced in accordance with the instantaneous value on node c. In practice, the current from single current source transistor 30 will never flow completely through one of the load current transistors 10 or 11. What will occur is that the majority of the current will flow through the appropriate load current transistor. Thus, 90% of the current can be flowing through load current transistor 10 with 10% of the current flowing through load current transistor 11. On the other hand, 80% of the current could flow through load current transistor 11 and 20% through load current transistor 10. In order for switching to occur between load current transistors 10 and 11, as discussed subsequently, it will be necessary for $V_{BBL}$ to have a value intermediate and preferably midway between the high level for node c and the low level for node c.

Figure 4:
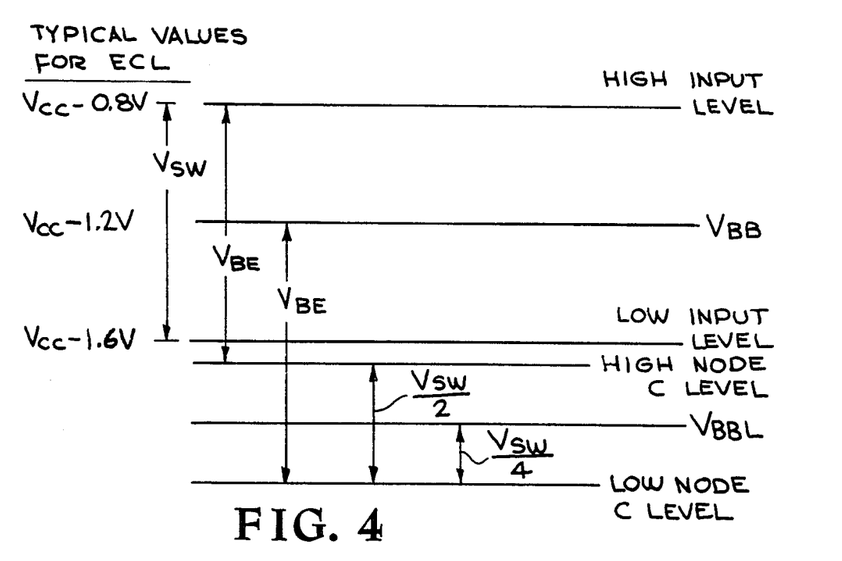
FIG. 4 is a voltage level diagram showing the value for the reference voltage, $V_{BBL}$, of FIGS. 2 and 3, as related to the value of $V_{BB}$.
Figure 5A:
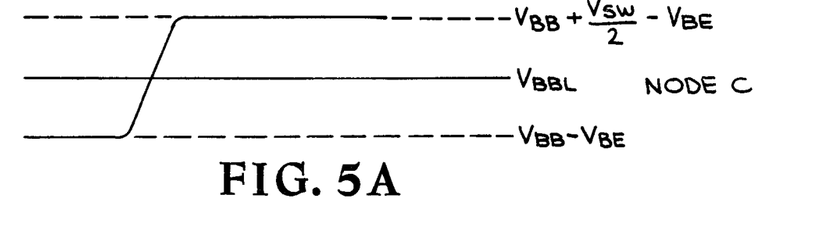
FIG. 5a shows the voltage level on node
Figure 5B:
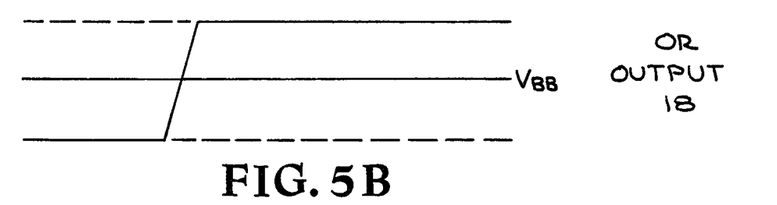
FIG. 5b shows the voltage level on OR output line 18.
Figure 5C:
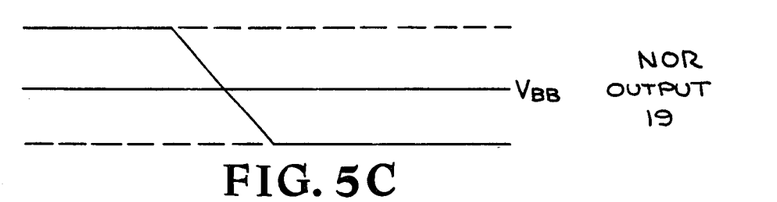
FIG. 5c shows the voltage level on NOR output line 19.
Figure 5D:
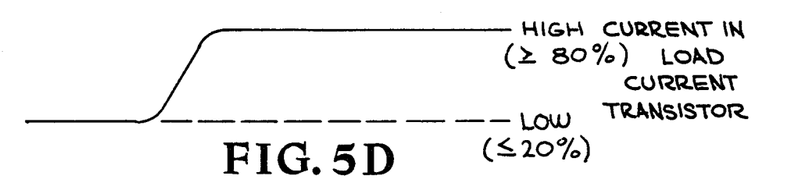
FIG. 5d shows the current in load current source transistor 10.
Figure 5E:
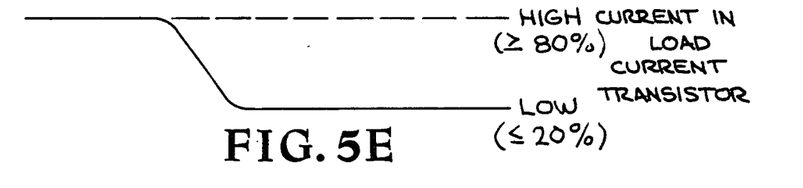
FIG. 5e shows the current in load current source transistor 11.

As shown in FIGS. 4 and 5a and as discussed subsequently, the reference voltage $V_{BBL}$ is an especially generated voltage preferably having the value of $$V_{BB} + \tfrac{1}{2} \cdot V_{SW} - V_{BE}$$

where
 $V_{BB}$ = on-chip reference voltage common to ECL circuits, typically −1.2v relative to $V_{CC}$, the supply voltage
 $V_{SW}$ = voltage swing between logic states, typically 0.7v or more; and
 $V_{BE}$ = one base-to-emitter voltage drop.

With this value, $V_{BBL}$ is midway between the HIGH and LOW levels for the voltage on node c. The selection of the value for $V_{BBL}$ may be understood with reference to FIG. 4. Here, the $V_{BB}$ level, as is well known in ECL circuit design, is chosen to be preferably midway between the HIGH input level for the input transistors 15 and 16 and the LOW level on these inputs. The difference between the LOW input level and the HIGH input level is designated the logic swing and typically has a value of 0.7 volts. This value is selected in order to ensure that the logic gate switches reliably between the one and zero states in the presence of noise. For the condition when one or both of the input signals A or B is HIGH then the level on node c will be $$V_{BB} + \tfrac{1}{2} V_{SW} - V_{BE}$$

since current will be flowing through one or both of the input transistors 15 or 16 rather than the reference transistor 17 as the input HIGH level on the base of at least one of the input transistors is higher than $V_{BB}$. This is shown by the dotted line located a base-to-emitter voltage $V_{BE}$ below the HIGH input level. For the condition when a LOW input level is impressed on the bases of both input transistors 15 and 16 then the voltage level on node c will be $V_{BB} - V_{BE}$ since current will be flowing through the reference transistor and not the input transistors the LOW input voltage will be lower than $V_{BB}$. Since the purpose of having $V_{BBL}$ is to provide a reference about which node c will swing, we would choose the value for $V_{BBL}$ to be intermediate and preferably midway between the HIGH and LOW levels for node c. By adding these two levels and dividing by two as shown in the following calculations, the preferred value for $V_{BBL}$ is obtained:

$$\frac{V_{BB} + \frac{1}{2}V_{SW} - V_{BE} + V_{BB} - V_{BE}}{2}$$

$$= \frac{2V_{BB} - 2V_{BE} + \frac{1}{2}V_{SW}}{2}$$

$$= V_{BB} - V_{BE} + \frac{V_{SW}}{4}$$

Figure 3:
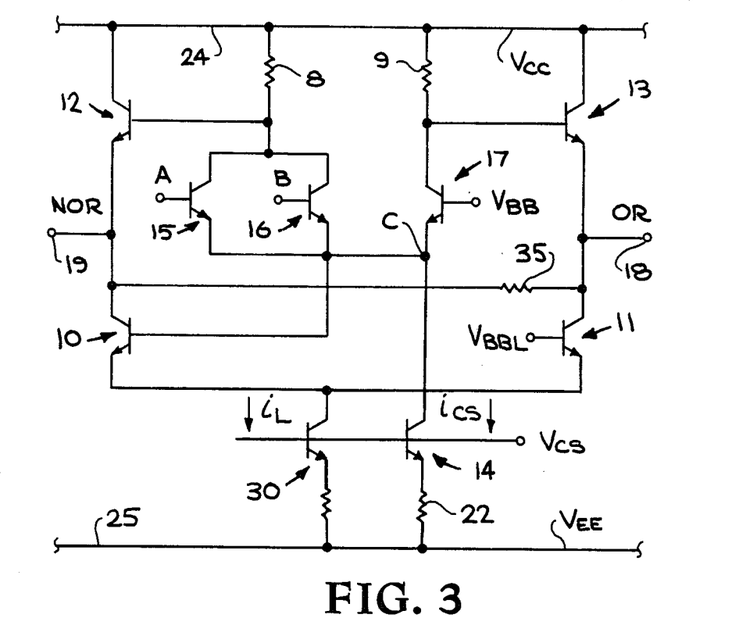
FIG. 3 is an alternate embodiment of the improved ECL OR/NOR gate of the present invention which includes a resistor between the collectors of the two load current source transistors.

In a preferred embodiment, shown in FIG. 3, an additional resistor 35 is connected between the collectors of load current transistors 10 and 11. The value of this resistor is chosen such that with the load current in it the voltage drop is approximately equal to the logic swing, $V_{SW}$. The ohmic rating will be comparable to the rating of resistors 8 or 9 which themselves determine the magnitude of the logic swing. As a result, this resistor defines the output swings on OR output line 18 and on NOR output line 19 by allowing the emitter-follower on the high output side to conduct and providing a defined value for the high output level. The value of the resistor 35 in combination with the emitter-follower on the low output side also determines the low output level.

The reference voltage $V_{BBL}$ may be generated in a separate voltage reference generator within an integrated circuit and distributed to each ECL OR/NOR gate as is done with $V_{BB}$. Such a generator may be of a type similar to that used to generate $V_{BB}$ as shown in *Integrated Circuits Applications Handbook*, ed. A. H. Seidman, p. 63 (Wiley 1983). Or, the value for $V_{BBL}$ can be derived from the available voltage $V_{BB}$. If the voltage $V_{BB}$ is applied across a resistor and a voltage $V_{BBL}$ is derived by tapping the resistor, then some power will be lost but much more power is saved by switching a single current source transistor between the two load current source transistors in accordance with the present invention. In any event, it is preferred that $V_{BBL}$ be generated on-chip so that it tracks the characteristics of other transistors on the chip.

Figure 6:
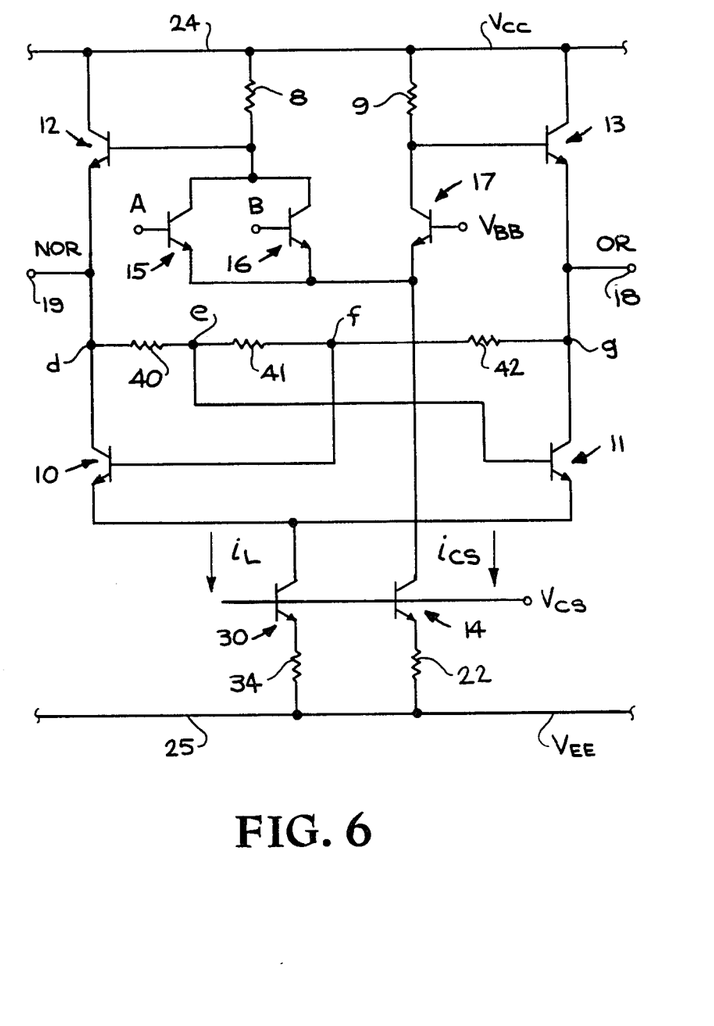
FIG. 6 is another embodiment of the improved ECL OR/NOR gate of the present invention.

Another embodiment of the present invention is shown in FIG. 6. In this embodiment there is no need to generate an independent reference voltage $V_{BBL}$ intermediate the voltage levels of the circuit point used to drive one of the load current source transistors. Instead, a resistor string consisting of resistors 40, 41 and 42 is connected between node d on NOR output line 19 and node g on OR output line 18. Resistor 41 may be of selected arbitrary value. Resistors 40 and 42 should be approximately equal to preserve the symmetry of switching. Node e between resistors 40 and 41 is connected to the base of load current source transistor 11 while node f between resistors 41 and 42 is connected to the base of load current source transistor 10. In this embodiment, rather than tie a base of one of the load current source transistors directly to a circuit point and having an intermediate reference voltage $V_{BBL}$, the base of each load current source transistor borrows a signal from the out-of-phase output. In borrowing a signal from the out-of-phase output, it is necessary to use an intervening resistor, i.e., resistors 40 and 42, so that the transistors do not saturate due to receiving the full output voltage on their bases.

In the embodiment of FIG. 6, when NOR output line 19 is high, a higher voltage will reside on the base of load current source transistor 11 than on the base of load current source transistor 10 so that the majority of the current from single load current source transistor 30 will flow through load current source transistor 11. Hence, load current source transistor will serve the appropriate function of pulling OR output line 18 down and keeping it down. Conversely, when OR output line 18 is high, the voltage on the base of load current source transistor 10 will be higher than the voltage on the base of load current source transistor 11 thereby allowing the majority of current from single load current source transistor 30 to flow through load current source transistor 10. In practice, the load current source transistor which carries the majority of the current will carry 80% or more of the current while the other load current source transistor will carry 20% or less of the current from single load current source transistor 30. The total current will be used more effectively than in the prior art approach of FIG. 1 and a significant power savings will be realized.

The advantages of the ECL OR/NOR gate of the present invention can be seen by reference to the timing diagrams of FIGS. 5a–5e. These diagrams show the operation of the embodiments of FIGS. 2 and 3. As is well understood in the ECL art, the voltage level on node c will shift after a change of the input signals on terminals A and B on input transistors 15 and 16, respectively. As shown in FIG. 5a, after the delay of one gate, the level on node c rises from $V_{BB} - V_{BE}$ to a level of $$V_{BB} + \frac{V_{SW}}{2} - V_{BE}.$$

After another short delay, the output on OR output line 18 rises and the output on NOR output line 19 undergoes a high-to-low transition. In accordance with the operation of the circuit of FIGS. 2-3 as described above, the current in load current transistor 10 will rise from some low level be low 20% to a high level of 80% or higher. Simultaneously, the current in load current transistor 11 will be reduced from a high current of 80% or more of the current through single current transistor 30 to a low level of less than 20%. As seen, no appreciable delay is introduced in the scheme of the present invention between the change in the input signal and the switching of the current between load current source transistors 10 and 11.

Figure 7:
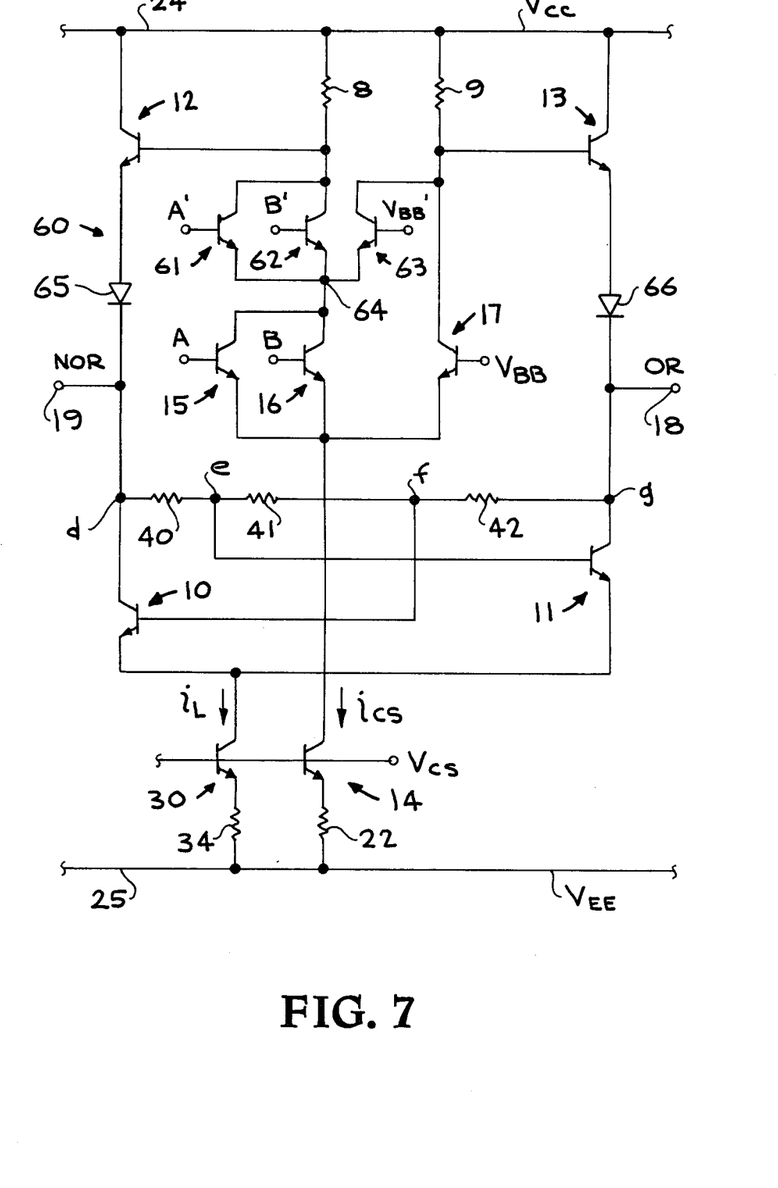
FIG. 7. illustrates an embodiment of the present invention in a multiple level logic gate.

FIG. 7 presents an embodiment of the present invention applied with a dual level logic gate 60. The dual level logic gate includes a second series of input transistors 61, 62 and a second reference transistor 63 interconnected at a common emitter node 64 which coupled to the collectors of the first series of input transistors 15, 16. A second base reference voltage $V_{BB'}$ is applied at the base of the second reference transistor 63. Input signals at a level corresponding to the second base reference voltage $V_{BB'}$ are applied to the bases of a second series of input transistors 61, 62 are indicated as A' and B'. A diode 65 in the NOR output line and diode 66 in the OR output line are provided to adjust the signal level of the outputs 18, 19. The dual level logic gate does not affect the operation of the load current switching described with reference to FIGS. 1 through 6.

Thus the present invention is adaptable to embodiments employing multiple level logic in such forms as are known in the art. The reference numbers applied to FIG. 7 are identical to those applied in FIG. 6 where appropriate.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the principle of driving the base of load current source transistors by tapping an out-of-current phase circuit point could also be applied in an embodiment employing multiple level logic. Such an application is contemplated by the present invention providing a single current source is thereby switched among various load current source transistors. The single logic level embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An emitter coupled logic gate having a true output and a complementary output, comprising:
    a reference transistor having a base connected to a switch reference voltage supply line, a collector connected through a first collector resistor to a $V_{CC}$ voltage supply line, and an emitter connected to a first common emitter node;
    at least one input transistor, each having a base connected to a respective input node, a collector connected at a common collector node and through a second collector resistor to the $V_{CC}$ voltage supply line, and an emitter connected to the first common emitter node;
    a first emitter follower transistor having a base connected to the collector of said reference transistor, a collector connected to the $V_{CC}$ voltage supply line, and an emitter connected to an output line supplying one output of the true or complementary outputs;
    a second emitter follower transistor having a base connected to the common collector node of said at least one input transistor, a collector connected to the $V_{CC}$ voltage supply line, and an emitter connected to an output line supplying the other output of the true or complementary outputs;
    a main current source supplying a gate current at the first common emitter node;
    a first load current source transistor having a base connected to a circuit node which experiences a voltage swing as the gate switches, a collector connected to the output line supplying said one output and an emitter connected to a second common emitter node, said voltage swing being out-of-shape with said one output as the gate switches;
    a second load current source transistor having a base connected to a reference node suppling a load reference voltage, a collector connected to the output line supplying said other output, and an emitter connected to said second common emitter node;
    a load current source supplying a load current at said second common emitter node; and
    a resistor connected between the output line supplying said one output and the output line supplying said other output.

2. The emitter coupled logic gate of claim 1, wherein:
    said logic gate has a logic swing voltage defining a difference between the true and complementary outputs when the gate is not switching; and
    said resistor has a resistance value given approximately by the logic swing voltage divided by the load current.

3. The emitter coupled logic gate of claim 2, wherein:
    said circuit node is said first common emitter node, and
    said reference node is connected to a load reference voltage supply line.

4. The emitter coupled logic gate of claim 1, wherein:
    said resistor includes a first resistor connected between the output line supplying said one output and a first node, a second resistor connected between said first node and a second node, and a third resistor connected between the output line supplying said other output and said second node; and wherein
    said circuit node is said second node; and
    said reference node is said first node.

5. The emitter coupled logic gate of claim 1, further including:
    a second series of input transistors having their emitters coupled to said common collector node and their collectors connected to a second common collector node and through said second collector resistor to the $V_{CC}$ voltage supply line;
    a second reference transistor having a base connected to a second switch reference voltage supply line, a collector connected through said first collector resistor to the $V_{CC}$ voltage supply line and an emitter connected to said common collector node in common with the emitters of said second series of input transistors; and
    a diode coupled between the emitter of said first emitter follower transistor and said output line supplying one output of the true or complementary outputs; and
    a diode connected between the emitter of second emitter follower transistor and said output line supplying the other output of the true or complementary outputs.

6. The emitter coupled logic gate of claim 1 wherein said load reference voltage has a value midway between said extreme values of the voltages experienced on said circuit node.

7. The emitter coupled logic gate of claim 2 wherein the value of said load reference voltage is given approximately by:

$$V_{BB}-V_{BE}+(V_{SW}/4)$$

where
    $V_{BB}$=said switch reference voltage $V_{BE}$=base-to-emitter voltage drop of said at least one input transistor $V_{SW}$=logic swing voltage.

8. The emitter coupled logic gate of claim 4 wherein said first resistor and said second resistor have approximately equal values.

9. The emitter coupled logic gate of claim 6, 5, 8, 1, 2, 3, 4, or 5, wherein said load current source comprises a transistor having an emitter coupled to a $V_{EE}$ voltage supply line, a collector connected to said second common emitter node and a base connected to a bandgap reference voltage generator.

10. The emitter coupled logic gate of claim 9 wherein said main current source comprises a transistor having an emitter coupled to the $V_{EE}$ voltage supply line, a collector connected to said first common emitter node, and a base, connected to said bandgap reference voltage generator.

* * * * *